(12) United States Patent
Wheeler et al.

(10) Patent No.: US 9,748,972 B2
(45) Date of Patent: Aug. 29, 2017

(54) LOSSLESS DATA COMPRESSION

(71) Applicant: Leco Corporation, St. Joseph, MI (US)

(72) Inventors: Mark Russell Wheeler, St. Joseph, MI (US); Scott Chrispell, Stevensville, MI (US)

(73) Assignee: Leco Corporation, St. Joseph, MI (US)

( * ) Notice: Subject to any disclaimer, the term of this patent is extended or adjusted under 35 U.S.C. 154(b) by 0 days.

(21) Appl. No.: 15/264,073

(22) Filed: Sep. 13, 2016

(65) Prior Publication Data
US 2017/0077949 A1   Mar. 16, 2017

Related U.S. Application Data

(60) Provisional application No. 62/218,279, filed on Sep. 14, 2015.

(51) Int. Cl.
   *H03M 7/40* (2006.01)

(52) U.S. Cl.
   CPC .................... *H03M 7/40* (2013.01)

(58) Field of Classification Search
   CPC ...... H04N 19/50; H04N 19/91; H04N 19/124; H04N 19/127; H04N 19/146; H04N 19/176; H04N 19/194; H03M 7/40
   USPC ..................................................... 341/50–70
   See application file for complete search history.

(56) References Cited

U.S. PATENT DOCUMENTS

| | | | | |
|---|---|---|---|---|
| 5,007,100 A * | 4/1991 | D'Aoust | ................... | G06T 1/20 382/303 |
| 5,287,416 A * | 2/1994 | Capo | ................... | G06T 1/20 358/448 |
| 5,473,326 A * | 12/1995 | Harrington | ........... | G06F 3/0601 341/106 |
| 5,678,043 A | 10/1997 | Ng et al. | | |
| 5,815,421 A | 9/1998 | Dulong et al. | | |
| 5,955,976 A * | 9/1999 | Heath | ................... | H03M 7/00 341/51 |
| 6,023,330 A | 2/2000 | Marshall et al. | | |
| 6,240,195 B1 * | 5/2001 | Bindner | ............... | H04R 25/353 375/372 |
| 6,292,115 B1 * | 9/2001 | Heath | ................ | H03M 7/3086 341/51 |
| 6,664,903 B2 * | 12/2003 | Kugai | ................ | H03M 7/3088 341/50 |
| 7,385,187 B2 | 6/2008 | Verentchikov et al. | | |
| 7,533,005 B2 | 5/2009 | Hsu et al. | | |
| 8,542,136 B1 * | 9/2013 | Owsley | ............... | H03M 7/3059 341/50 |
| 9,048,080 B2 | 6/2015 | Verenchikov et al. | | |

(Continued)

OTHER PUBLICATIONS

International Search Report, PCT/US2016/051588, Dec. 29, 2016, 8 pages.

*Primary Examiner* — Lam T Mai
(74) *Attorney, Agent, or Firm* — Price Heneveld LLP

(57) ABSTRACT

An analytical instrument includes a data acquisition system that produces data. The analytical instrument includes a data compression system/process that utilizes a lossless data compression technique that can be implemented using minimal hardware and software resources. The process may be implemented in such a way that it can be split into many parallel operations. The process can be implemented utilizing software and/or processing devices such as Field-Programmable Gate Arrays (FPGAs) or Graphics Processing Units (GPUs).

20 Claims, 3 Drawing Sheets

(56) References Cited

U.S. PATENT DOCUMENTS

| | | | |
|---|---|---|---|
| 9,077,965 B2 | 7/2015 | Wu et al. | |
| 9,083,952 B2 | 7/2015 | Gonen et al. | |
| 9,116,908 B2 | 8/2015 | Fallon | |
| 9,312,119 B2 | 4/2016 | Verenchikov | |
| 9,406,493 B2 | 8/2016 | Verenchikov | |
| 9,425,034 B2 | 8/2016 | Verenchikov et al. | |
| 2002/0057213 A1* | 5/2002 | Heath | H03M 7/3088 341/51 |
| 2003/0084081 A1 | 5/2003 | Hanounik | |
| 2014/0354666 A1* | 12/2014 | Yang | H04N 19/50 345/555 |
| 2015/0347442 A1* | 12/2015 | Lawrence | G06F 17/30156 707/692 |

* cited by examiner

US 9,748,972 B2

LOSSLESS DATA COMPRESSION

CROSS-REFERENCE TO RELATED APPLICATION

This application claims the benefit of U.S. Provisional Application No. 62/218,279 filed on Sep. 14, 2015, entitled, "LOSSLESS DATA COMPRESSION," the entire contents of which are incorporated herein by reference.

BRIEF SUMMARY OF THE INVENTION

One aspect of the present disclosure is an analytical instrument including a data acquisition system that produces data. The data acquisition system may comprise a spectrometer or other device. The analytical instrument includes a data compression system and process that utilizes a lossless data compression technique that can be implemented using minimal hardware and software resources. The process may be implemented in such a way that it can be split into many parallel operations. The process can be implemented utilizing software and/or processing devices such as Field-Programmable Gate Arrays (FPGAs) or Graphics Processing Units (GPUs).

Another aspect of the present disclosure is a process that leverages similarity across varying dimensions of a data set. These similarities may exist in temporal and/or spatial dimensions. However, the present invention is not restricted to these dimensions.

Another aspect of the present disclosure is a method of improving operation of a system that includes an analytical instrument having a data acquisition system that is configured to generate a stream of digital data comprising N numbers of size n. The numbers correspond to a magnitude of a measured variable in which at least some of the numbers include at least one zero. The system includes a processing device that is operably connected to the data acquisition system. The data acquisition system and the processing device may be housed within the analytical instrument, or the system may comprise separate components that are operably interconnected utilizing "hard" lines, wireless communication devices, or other suitable arrangement. The method includes providing the processing device with an original stream of digital data from the data acquisition system, and causing the processing device to segment the stream of data to form at least one segmented array of data. The method also includes causing the processing device to transpose the at least one segmented array of data to form at least one (segmented) transposed array of data. The method may include causing the processing device to split the at least one transposed array of data to form at least one interleaved array of data. The processing device run length and codes leading zeros of the numbers to form compressed data and reduce the amount of memory required to store the data. The compressed data is then stored in memory. The stream of data may be segmented into segmented arrays of size n×n. The segmented arrays of data may be transformed into at least one interleaved array of data of size (2n)×(n/2). The transposed array of data may optionally be reversed. Also, numbers that do not include at least one leading zero may not be compressed, and uncompressed data may be stored with the compressed data in a memory unit. The compressed and/or uncompressed data may be transferred (via a conductor/wire, or wirelessly) to a computer having a processor that is configured to decompress the compressed data.

Another aspect of the present disclosure is an analytical instrument including a data acquisition system that is configured to generate a stream of digital data comprising N numbers of size n corresponding to a magnitude of a measured variable in which at least some of the numbers include at least one zero. The analytical instrument includes a processing device that is configured to receive a stream of data from the data acquisition system. The processing device is configured to segment the stream of data to form at least one segmented array of data, transpose the at least one segmented array of data to form at least one transposed array of data. The processor is also configured to split the at least one transposed array of data to form at least one interleaved array of data, and to run length and code leading zeros of the numbers to form compressed data to thereby reduce the amount of memory required to store the compressed data. The processing device is also configured to store the compressed data in memory. The processing device and memory may be housed within the analytical instrument. Alternatively, these components may be separate components that are operably connected to the data acquisition system.

These and other features, advantages, and objects of the present invention will be further understood and appreciated by those skilled in the art by reference to the following specification, claims, and appended drawings.

DETAILED DESCRIPTION

Figure 1:
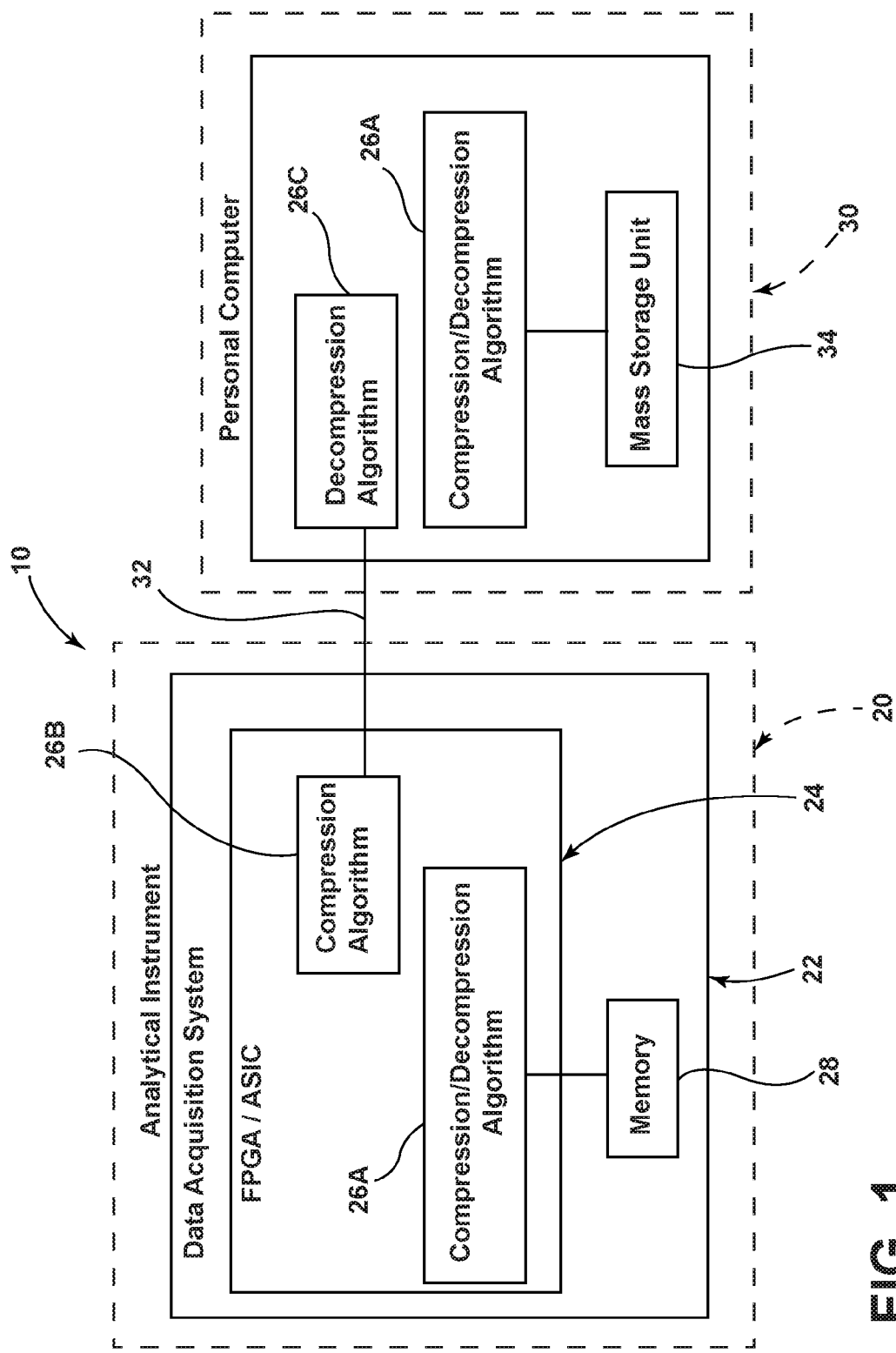
FIG. 1 is a block diagram showing an analytical instrument including a data acquisition system according to one aspect of the present disclosure.

With reference to FIG. 1, a system 10 includes an analytical instrument 20 that may be operably connected to a computing device such as personal computer 30. The analytical instrument 20 may comprise a spectrometer such as a glow discharge atomic emissions spectrometer. The analytical instrument 20 may also comprise other instruments such as a gravimetric analyzer, an ash fusion measuring device, a calorimeter, an elemental analyzer, a digital microscope, a mass spectrometer, an audio device, or other device that generates and/or processes data. The analytical instrument 20 includes a data acquisition system 22 that is configured to generate a stream of digital data comprising N numbers of size n corresponding to a magnitude of a measured variable in which at least some of the numbers include at least one zero. The data produced by the data acquisition system 22 may be in the form of a stream of data in which many, most, or all of the individual numbers include at least one leading zero. For example, if the individual numbers are 16 bit numbers that correspond to the magnitude of a measured variable the numbers may include one or more leading zeros if the magnitude of the measured variable is less than a maximum possible magnitude. It will be understood that the numbers could be formatted in reverse order such that zeros corresponding to less than a maximum possible magnitude appear as trailing zeros rather than leading zeros. As used herein, the terms "leading zero" and "leading zeros" generally refer to any numbering format in which numbers that are less than a maximum possible value include at least one zero.

The system 10 also includes a processing device 24. The processing device 24 may comprise a field-programmable array (FPGA), a graphics processing unit (GPU) or other suitable processor. It will be understood that the processing device 24 could comprise virtually any type of processor. The processing device 24 may be housed within analytical instrument 20. Alternatively, the processing device 24 may be housed separately from the analytical instrument 20 and/or data acquisition system 22. Accordingly, it will be understood that the arrangement of FIG. 1 is not necessarily limited to a specific physical configuration.

The processing device 24 may be programmed to execute an algorithm for compressing and/or decompressing data generated by the data acquisition system 22. In FIG. 1, a compression/decompression algorithm is designated "26A," and a compression algorithm is designated "26B." However, these designations are provided for purposes of explanation herein, and the present disclosure is not necessarily limited to separate compression and decompression algorithms/processes. The processing device 24 is operably connected to memory 28. The memory 28 may be part of the data acquisition system 22, or it may comprise a separate memory that is operably connected to the processing device 24. In general, the memory 28 may comprise a hard drive, solid state memory that is portable or fixed, an optical storage device (e.g. optical disc drive and optical disc/CD/DVD, etc.) or other suitable memory.

The analytical instrument 20 may optionally be interconnected to a computer such as personal computer 30 as shown by line 32. It will be understood that line 32 may comprise a wireless connection, cable, or other suitable data transfer arrangement such as a flash memory, optical disc, or the like that can be utilized to transfer data from analytical instrument 20 to personal computer 30. As discussed in more detail below, personal computer 30 may include a decompression algorithm 26C and a compression/decompression algorithm 26A. It will be understood that these algorithms/processes are not necessarily separate, and the designations "26A" and "26C" are provided for purposes of discussion. Also, analytical instrument 20 could include only compression algorithm 26B and computer 30 could include only a decompression algorithm 26C. The personal computer 30 includes memory capability such as mass storage unit 34. Mass storage unit 34 may comprise a disc drive, solid state memory, or removable memory storage such as an optical drive/disc, flash memory, or the like.

Figure 2:
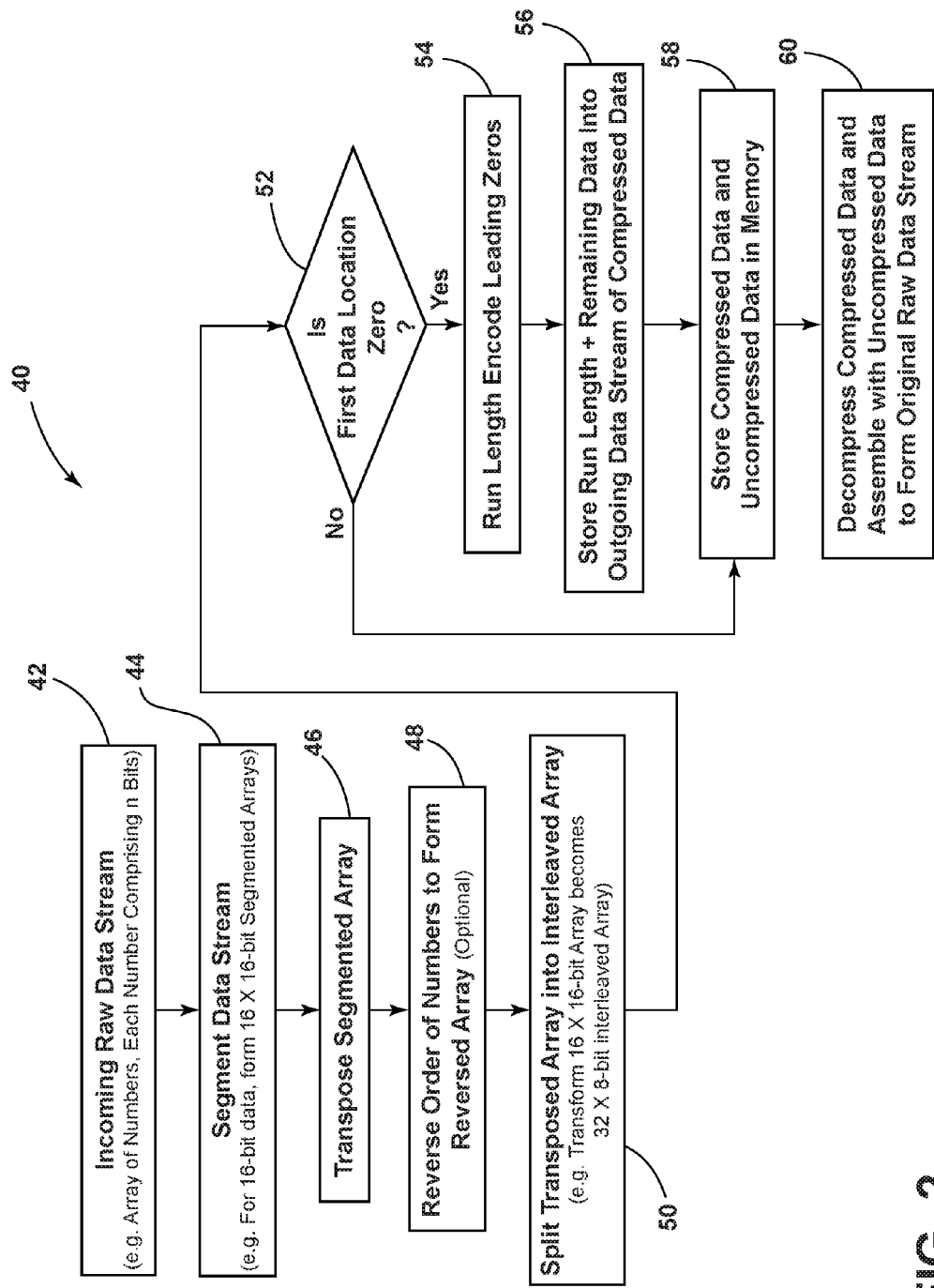
FIG. 2 is a flow chart showing operation of the system of FIG. 1.

With further reference to FIG. 2, the compression/decompression process 40 generally starts at step 42. At step 42, an incoming raw data stream is received by a processor such as processing device 24. The incoming raw data stream may comprise an array of N numbers, each number comprising n bits. For example, each number may comprise 4, 8, 16, 32, 64 or more bits. At step 44, the incoming raw data stream is segmented to form segmented arrays. For example, for 16 bit data 16×16 bit segmented arrays are formed. At step 46, each segmented array is transposed. At step 48, the order of the numbers is optionally reversed to form a reversed segmented array.

At step 50, the segmented (and optionally reversed) array is split or transformed into an interleaved array. For example, a 16×16 bit array becomes a 32×8 bit interleaved array.

At step 52, the algorithm determines if a first data location of each number is 0. For example, if a 32×8 bit interleaved array is formed at step 50, at step 52 the algorithm determines if each 8 bit number includes a leading zero. As discussed above, the "first" data location would not necessarily need to be a leading zero if the numbers are formatted such that trailing zeros are present if an individual number is less than a maximum possible value. In general, the first data location zero condition could occur whenever an individual number is less than a maximum possible value for the number, regardless of the format of the numbers.

If the first data location is zero (step 52), the algorithm then run length encodes the leading zeros as shown at step 54, and the run length data and remaining data (i.e. the non-zero portion of each number) is then formed into an outgoing data stream of compressed data as shown at step 56. At step 58, the compressed data stream of step 56 is combined with uncompressed data from step 52 and stored in memory. The uncompressed data from step 52 comprises numbers that do not have a zero first data location.

At step 60, the compressed data is decompressed and assembled (i.e. combined) with the uncompressed data previously stored at step 58 to form the original raw data stream. As noted above, the stored data (step 58) may be stored in a memory 28 associated with analytical instrument 20, and/or it may be stored on a mass storage unit 34 of a personal computer 30 or the like. Similarly, the data may be decompressed by processing device 24 which is associated with analytical instrument 20, and/or the data may be decompressed utilizing a personal computer 30 or other suitable device.

In general, decompression involves separating the compressed data from the uncompressed data, and steps 44, 46, 48, 50, 54 and 56 are then reversed, and inverse operations are performed. For example, run length decoding is performed to generate numbers including one or more zeros, and interleaved arrays are formed. The interleaved arrays are transformed into transposed arrays of size n×n. If the order of the arrays was reversed during compression, the array is reversed during the decompression process to reform the transposed segmented array. The transposed segmented array is then transposed to form segmented arrays, which are then combined (assembled) to reform the original raw data stream.

Figure 3:
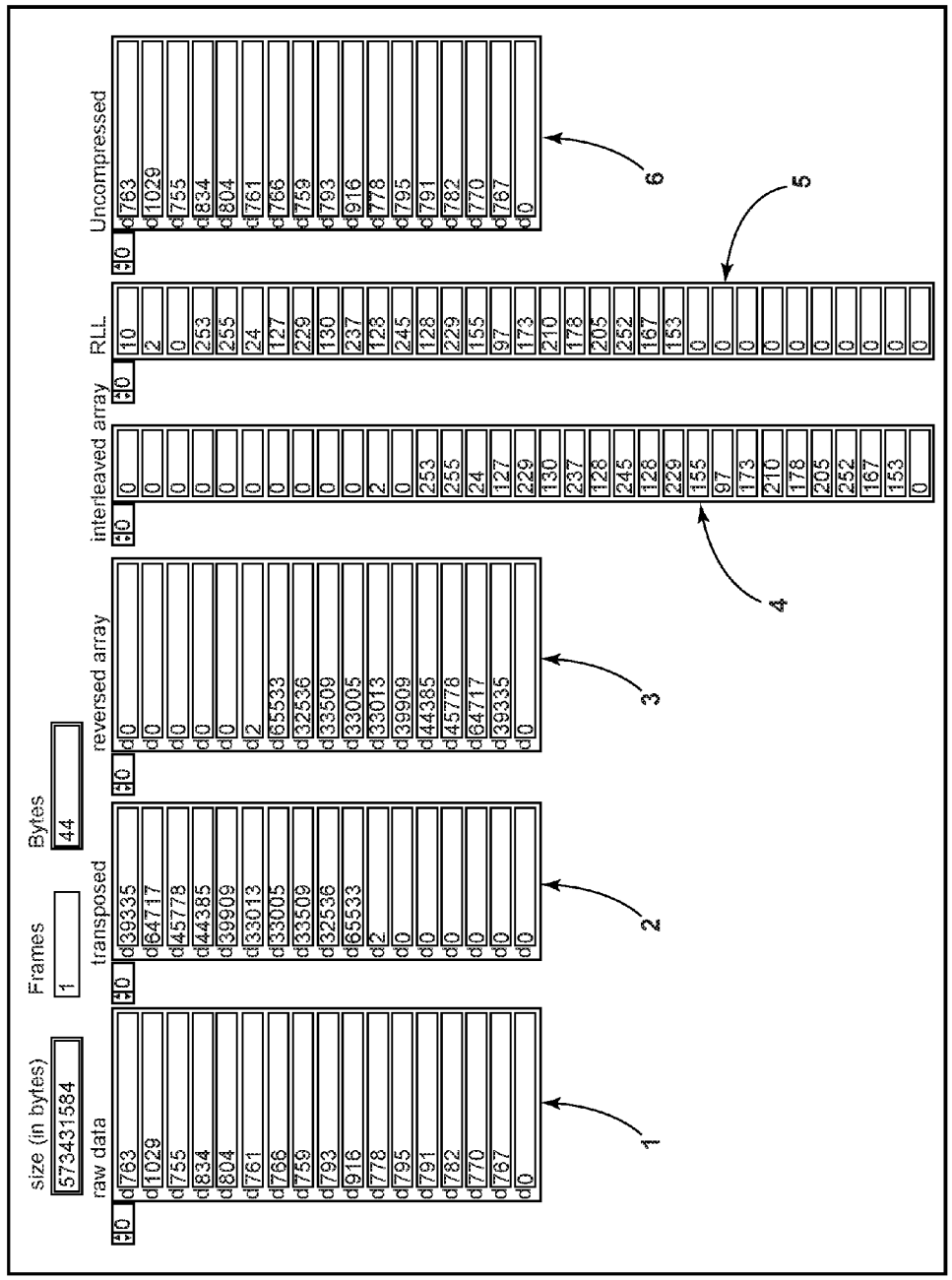
FIG. 3 shows the processing steps for one segmented array of data.

FIG. 3 is an example showing a process according to FIG. 2. The example utilizes an array of data of 16-bit numbers of size N. Typically, this data is streamed from a device such as an analog to digital converter (ADC). The data may comprise virtually any type of data. For example, the data may comprise measurements generated by devices such as glow discharge atomic emissions spectrometers, thermal gravimetric analyzers, ash fusion measuring devices, calorimeters, elemental analyzers, digital microscopes, mass spectrometers, audio devices, or virtually any other type of device that measures/generates data and/or processes data. For example, the system/device/processes of the present disclosure may be implemented in connection with the spectrometers of U.S. Pat. Nos. 9,425,034, 9,406,493, 9,312,119, 9,048,080, 7,385,187, 6,023,330. The entire contents of each of these patents is hereby incorporated by reference.

The data may include significant numbers of zeros. For example, in an audio-based system, the volume of the sound may be represented by an n-bit (e.g. 16-bit) number. In many instances, a majority of the sound that is measured may not be exceptionally loud, such that all or most of the measured data includes at least one zero, indicating that the measured audio signal has not reached the maximum value.

In the following example, each data point is represented using a 16-bit number. However, it will be understood that more or fewer bits may be utilized as required for a particular application. For example, each data point may comprise an 8-bit, 32-bit, 64-bit number. Furthermore, it will be understood that the following example is not limited to any particular type of data.

Table 1 represents an array (stream) of data (16-bit numbers) of N-size:

| N | D15 | D14 | D13 | D12 | D11 | D10 | D9 | D8 | D7 | D6 | D5 | D4 | D3 | D2 | D1 | D0 |
|---|-----|-----|-----|-----|-----|-----|----|----|----|----|----|----|----|----|----|-----|
| 0 | 0,15 | 0,14 | 0,13 | 0,12 | 0,11 | 0,10 | 0,9 | 0,8 | 0,7 | 0,6 | 0,5 | 0,4 | 0,3 | 0,2 | 0,1 | 0,0 |
| 1 | 1,15 | 1,14 | 1,13 | 1,12 | 1,11 | 1,10 | 1,9 | 1,8 | 1,7 | 1,6 | 1,5 | 1,4 | 1,3 | 1,2 | 1,1 | 1,0 |
| 2 | 2,15 | 2,14 | 2,13 | 2,12 | 2,11 | 2,10 | 2,9 | 2,8 | 2,7 | 2,6 | 2,5 | 2,4 | 2,3 | 2,2 | 2,1 | 2,0 |
| 3 | 3,15 | 3,14 | 3,13 | 3,12 | 3,11 | 3,10 | 3,9 | 3,8 | 3,7 | 3,6 | 3,5 | 3,4 | 3,3 | 3,2 | 3,1 | 3,0 |
| 4 | 4,15 | 4,14 | 4,13 | 4,12 | 4,11 | 4,10 | 4,9 | 4,8 | 4,7 | 4,6 | 4,5 | 4,4 | 4,3 | 4,2 | 4,1 | 4,0 |
| ... | | | | | | | | | | | | | | | | |
| N | n,15 | n,14 | n,13 | n,12 | n,11 | n,10 | n,9 | n,8 | n,7 | n,6 | n,5 | n,4 | n,3 | n,2 | n,1 | n,0 |

The first step of the compression process is to segment the array (stream) of raw data into at least one segmented array of size n×n. In the case of 16 numbers, each of 16-bit size, 16×16 segmented arrays are formed as shown in Table 2:

| N | D15 | D14 | D13 | D12 | D11 | D10 | D9 | D8 | D7 | D6 | D5 | D4 | D3 | D2 | D1 | D0 |
|---|-----|-----|-----|-----|-----|-----|----|----|----|----|----|----|----|----|----|-----|
| 0 | 0,15 | 0,14 | 0,13 | 0,12 | 0,11 | 0,10 | 0,9 | 0,8 | 0,7 | 0,6 | 0,5 | 0,4 | 0,3 | 0,2 | 0,1 | 0,0 |
| 1 | 1,15 | 1,14 | 1,13 | 1,12 | 1,11 | 1,10 | 1,9 | 1,8 | 1,7 | 1,6 | 1,5 | 1,4 | 1,3 | 1,2 | 1,1 | 1,0 |
| 2 | 2,15 | 2,14 | 2,13 | 2,12 | 2,11 | 2,10 | 2,9 | 2,8 | 2,7 | 2,6 | 2,5 | 2,4 | 2,3 | 2,2 | 2,1 | 2,0 |
| 3 | 3,15 | 3,14 | 3,13 | 3,12 | 3,11 | 3,10 | 3,9 | 3,8 | 3,7 | 3,6 | 3,5 | 3,4 | 3,3 | 3,2 | 3,1 | 3,0 |
| 4 | 4,15 | 4,14 | 4,13 | 4,12 | 4,11 | 4,10 | 4,9 | 4,8 | 4,7 | 4,6 | 4,5 | 4,4 | 4,3 | 4,2 | 4,1 | 4,0 |
| ... | | | | | | | | | | | | | | | | |
| 15 | 15,15 | 15,14 | 15,13 | 15,12 | 15,11 | 15,10 | 15,9 | 15,8 | 15,7 | 15,6 | 15,5 | 15,4 | 15,3 | 15,2 | 15,1 | 15,0 |

Because the process utilizes smaller portions of the raw data stream, there is typically no need to store the entire array of N size before the compression process begins.

The next step is to transpose the segmented n×n (e.g. 16×16) array by each bit location as shown in Table 3:

| N | D15 | D14 | D13 | D12 | D11 | D10 | D9 | D8 | D7 | D6 | D5 | D4 | D3 | D2 | D1 | D0 |
|---|-----|-----|-----|-----|-----|-----|----|----|----|----|----|----|----|----|----|-----|
| 0 | 15,15 | 14,15 | 13,15 | 12,15 | 11,15 | 10,15 | 9,15 | 8,15 | 7,15 | 6,15 | 5,15 | 4,15 | 3,15 | 2,15 | 1,15 | 0,15 |
| 1 | 15,14 | 14,14 | 13,14 | 12,14 | 11,14 | 10,14 | 9,14 | 8,14 | 7,14 | 6,14 | 5,14 | 4,14 | 3,14 | 2,14 | 1,14 | 0,14 |
| 2 | 15,13 | 14,13 | 13,13 | 12,13 | 11,13 | 10,13 | 9,13 | 8,13 | 7,13 | 6,13 | 5,13 | 4,13 | 3,13 | 2,13 | 1,13 | 0,13 |
| 3 | 15,12 | 14,12 | 13,12 | 12,12 | 11,12 | 10,12 | 9,12 | 8,12 | 7,12 | 6,12 | 5,12 | 4,12 | 3,12 | 2,12 | 1,12 | 0,12 |
| 4 | 15,11 | 14,11 | 13,11 | 12,11 | 11,11 | 10,11 | 9,11 | 8,11 | 7,11 | 6,11 | 5,11 | 4,11 | 3,11 | 2,11 | 1,11 | 0,11 |
| ... | | | | | | | | | | | | | | | | |
| 15 | 15,0 | 14,0 | 13,0 | 12,0 | 11,0 | 10,0 | 9,0 | 8,0 | 7,0 | 6,0 | 5,0 | 4,0 | 3,0 | 2,0 | 1,0 | 0,0 |

This tends to pack or position any zeros toward one side of the array.

As discussed below, in connection with FIG. 3, the order of the numbers may then be reversed to shift the zeros to the other side of the array to form a reversed transposed array.

The data forming the transposed (reversed) array is then broken into 8-bit pairs to form an interleaved array of data as shown in Table 4:

| N | D7 | D6 | D5 | D4 | D3 | D2 | D1 | D0 |
|---|----|----|----|----|----|----|----|-----|
| 0 | 7,15 | 6,15 | 5,15 | 4,15 | 3,15 | 2,15 | 1,15 | 0,15 |
| 1 | 15,15 | 14,15 | 13,15 | 12,15 | 11,15 | 10,15 | 9,15 | 8,15 |
| 2 | 7,14 | 6,14 | 5,14 | 4,14 | 3,14 | 2,14 | 1,14 | 0,14 |
| 3 | 15,14 | 14,14 | 13,14 | 12,14 | 11,14 | 10,14 | 9,14 | 8,14 |
| 4 | 7,13 | 6,13 | 5,13 | 4,13 | 3,13 | 2,13 | 1,13 | 0,13 |
| ... | | | | | | | | |
| 31 | 15,0 | 14,0 | 13,0 | 12,0 | 11,0 | 10,0 | 9,0 | 8,0 |

Breaking the bit into 8-bit pairs (interleaved array) as shown in table 4 saves a single byte that may be used to store the run length information. The interleaved array is generally in the form of a (2n)×(n/2) array.

Next, the process includes run length encoding of only the first data (row) in the array as shown in Table 5:

| N | D7 | D6 | D5 | D4 | D3 | D2 | D1 | D0 |
|---|----|----|----|----|----|----|----|-----|
| 0 | RLL7 | RLL6 | RLL5 | RLL4 | RLL3 | RLL2 | RLL1 | RLL0 |
| 1 | UD0,7 | UD0,6 | UD0,5 | UD0,4 | UD0,3 | UD0,2 | UD0,1 | UD0,0 |
| 2 | UD1,7 | UD1,6 | UD1,5 | UD1,4 | UD1,3 | UD1,2 | UD1,1 | UD1,0 |
| 3 | UD2,7 | UD2,6 | UD2,5 | UD2,4 | UD2,3 | UD2,2 | UD2,1 | UD2,0 |
| ... | | | | | | | | |

Data that is deeper in the array is typically more "feature rich" and less compressible. To compress the data, it is determined if the first data location is 0. If it is non-zero, no compression will take place. In the example of table 5, the RLL (run length) can be up to 32 bytes. In Table 5, UD is the remaining uncompressed data.

FIG. 3 is an example showing the processing steps for one segmented array of data. In FIG. 3, the process starts with 16 numbers as shown in column 1 ("raw data"). In column 1, the raw data has been segmented to form a 16×16-bit array. The raw data is then bitwise transposed as shown in column 2 ("transposed"). The order of the numbers is then reversed as shown in column 3 ("reversed array"). As discussed above, reversing the array is optional. The data (reversed array) is then converted from 16×16-bit words into 32×8-bit bytes to form an interleaved array as shown in column 4 ("interleaved array"). The leading zeros are then run length encoded to form the final compression as shown in column 5 ("RLL").

Decompression may be performed by reversing the steps outlined above utilizing inverse functions to reproduce the uncompressed data as shown in column 6 ("uncompressed"). Specifically, to decompress the data of column 5, an inverse run length encoding step is first performed to form an interleaved array (column 4). The 32×8-bit bytes (interleaved array) are then converted into 16×16-bit words (reversed array). The order of the reversed array is then reversed (if reversing occurred during compression) to form a transposed array. The transposed array is then transposed to form the original segmented 16×16-bit raw data array. Individual segmented arrays can then be assembled to form the original array of data of N-size.

Referring again to columns 4 and 5 (FIG. 1), in the illustrated example the subarray size is 16 integers. The first byte (column 5) is the number of zeros in the subarray (column 4). Thus, in the illustrated example, the first byte (10) in column 5 corresponds to the number of zeros (10) at the top of the interleaved array of column 4. The first byte (column 5) can be subtracted from the total to determine the number where the next subarray begins.

The process/algorithm described above has been tested utilizing data from various data acquisition systems. In the test cases, the compression ratio has been more than 20 percent. Adding more steps may yield higher ratios, but would require more resources. It will be understood that the format could be changed to 32-bits, 64-bits, 8-bits, etc. for a particular application.

Another aspect of the present disclosure involves leveraging similarity across varying dimensions of a data set. The initial expansion in dimensionality of the lossless data compression approach leveraged the similarity between a data set in time. Taking the differences between two observations of such a data set in time will not utilize all of the bits thus allowing it to be compressed with the lossless data compression described initially.

The following describes this (optional) aspect of a method or process according to the present disclosure. In the following discussion, Y represents the observations and is of size T×N. T represents the total number of samples in time, and N represents the length of each individual data set. Y(0,n) represents the first data set in time at location n, Y(1,n) represents the second data set in time at location n, and Y(T,n) represents the last data set in time at location n.

Let D(t,n) represent the difference between two data sets at time t location n. Note the exception to the first value D.

$$D(0,n)=Y(0,n) \tag{1.0}$$

$$D(1,n)=Y(1,n)-Y(0,n) \tag{1.1}$$

$$D(T,n)=Y(T,n)-Y(T-1,n) \tag{1.2}$$

The data contained in D will have both positive and negative numbers as Y is not required to be monotonic. In order to preserve the sign of the difference another parameter S is utilized.

$$S(t,n)=\text{sign}(D(t,n)) \tag{1.3}$$

Because the sign information is preserved, the absolute value of D can be taken, thus eliminating the need for the storage of a twos compliment for negative numbers. This step results in zeros being present in the upper bits of the D values, resulting in highly compressible data using the process described above in connection with FIG. 2 and Tables 1-5.

$$D(t,n)=\text{abs}(D(t,n)) \tag{1.4}$$

D(1,1:n) will be compressed for each observation at time t based on the initial description of the process described above in connection with FIG. 2 and Tables 1-5. An exception is that the sign information must be contained in the compressed data. This is achieved by storing the sign information between the RLL and UD data as shown in Table 6:

| N | D7 | D6 | D5 | D4 | D3 | D2 | D1 | D0 |
|---|----|----|----|----|----|----|----|----|
| 0 | RLL7 | RLL6 | RLL5 | RLL4 | RLL3 | RLL2 | RLL1 | RLL0 |
| 1 | UD0,7 | UD0,6 | UD0,5 | UD0,4 | UD0,3 | UD0,2 | UD0,1 | UD0,0 |
| 2 | UD1,7 | UD1,6 | UD1,5 | UD1,4 | UD1,3 | UD1,2 | UD1,1 | UD1,0 |
| 3 | UD2,7 | UD2,6 | UD2,5 | UD2,4 | UD2,3 | UD2,2 | UD2,1 | UD2,0 |

Table 6 is substantially the same as Table 5 (above). Run length (RLL) can be up to 32 bytes for this example. The remaining uncompressed data (UD) shown in Table 6.

The following is used to store the sign information of each difference via the SD field:

RLL-Run length can be up to 32 bytes for this example.

SD—Each bit represents the sign of a difference at location n. This is stored as a 16-bit number based on the example that uses a 16 element sub-array.

UD-Is the remaining uncompressed data as shown in Table 7:

| N | D7 | D6 | D5 | D4 | D3 | D2 | D1 | D0 |
|---|----|----|----|----|----|----|----|----|
| 0 | RLL7 | RLL6 | RLL5 | RLL4 | RLL3 | RLL2 | RLL1 | RLL0 |
| 1 | SD15 | SD14 | SD13 | SD12 | SD11 | SD10 | SD9 | SD8 |

-continued

| N | D7 | D6 | D5 | D4 | D3 | D2 | D1 | D0 |
|---|----|----|----|----|----|----|----|----|
| 2 | SD7 | SD6 | SD5 | SD4 | SD3 | SD2 | SD1 | SD0 |
| 3 | UD0,7 | UD0,6 | UD0,5 | UD0,4 | UD0,3 | UD00,2 | UD0,1 | UD0,0 |
| 4 | UD1,7 | UD1,6 | UD1,5 | UD1,4 | UD1,3 | UD1,2 | UD1,1 | UD1,0 |
| 5 | UD2,7 | UD2,6 | UD2,5 | UD2,4 | UD2,3 | UD2,2 | UD2,1 | UD2,0 |
| ... | | | | | | | | |

It is noted that when t=0 all of the sign bits will be zero since no difference has actually occurred.

The decompression of a sub-array is performed using the RLL and UD fields as described above in connection with Tables 1-5 and FIGS. 1 and 2. The SD field, however, must be preserved such that it can be used to determine if the data at the time t is a sum or difference of the data at t-1 for each data point n. As an example:

The decompression of D(0,n) will yield Y(0,n)

Upon decompressing D(1,n) the value of Y(1,n) is found by the following equation:

$Y(1,n) = Y(0,n) + D(1,n)$ when $SD(1,n)$ is 0

$Y(1,n) = Y(0,n) - D(1,n)$ when $SD(1,n)$ is 1

The process/algorithm above provides a lossless data compression that leverages the compressibility in multiple dimensions at once. The first dimension is the spatial dimension of the data resulting in the fact that much of the data is at a similar intensity. The second dimension leverages the fact that the data in time has little variability. Combining these two methods has resulted in data compressions exceeding 50%.

As discussed above in connection with Tables 1-5 and FIGS. 1 and 2, the data format is not restricted to a size of 16-bits. Similarly, the process described in connection with Tables 6 and 7 is not restricted to initial 1×N data sets, nor 1×N data sets observed T times, i.e. data sets of size T×N. The processes of the present invention can be applied to data sets of size M×N, such as images, or to data sets of size M×N×T, such as videos.

As noted above, the processes of the present disclosure may be utilized in connection with a wide range of devices. Such devices may include an analog to digital convertor that creates a stream of digital data that may be compressed utilizing the processes described above. Following compression and/or data processing, the data may be utilized to provide a data display on a screen. For example, the data may be displayed in a graphic format on the screen of an analytical instrument having a data acquisition system/device or a screen of a laptop computer or other suitable device.

The methods described herein may be performed by processing device 24, which executes instructions of the above-described algorithms 26A and/or 26B. These instructions may be stored in a non-transitory computer-readable medium, such as memory 28.

Also, it will be understood that the data may initially be compressed utilizing a device such as an FPGA or GPU of a data acquisition system/device, and the data may later be decompressed by the FPGA or GPU, or the data may be decompressed utilizing a laptop computer or other suitable device.

What is claimed is:

1. A method of improving operation of a system including an analytical instrument that includes a data acquisition system that is configured to generate a stream of digital data comprising N numbers of size n corresponding to a magnitude of a measured variable in which at least some of the numbers include at least one zero and wherein the system includes a processing device that is operably connected to the data acquisition system, the method comprising:
   providing the processing device with an original stream of digital data comprising N numbers of size n from the data acquisition system;
   causing the processing device to segment at least a portion of the original stream of data to form at least one segmented array of data;
   causing the processing device to transpose the at least one segmented array of data to form at least one transposed array of data;
   causing the processing device to split the at least one transposed array of data to form at least one interleaved array of data to thereby save at least a byte in memory that can be utilized to store run length information;
   causing the processing device to run length encode leading zeros of the numbers to form compressed data comprising run length information to reduce an amount of memory required to store the compressed data; and
   storing the compressed data in memory.

2. The method of claim 1, wherein:
   causing the processing device to segment the at least a portion of the original stream of data into at least one segmented array of size n×n.

3. The method of claim 2, further including:
   causing the processing device to transform the at least one segmented array of data into at least one interleaved array of data of size (2n)×(n/2).

4. The method of claim 1, further including:
   causing the processing device to reverse the transposed array of data.

5. The method of claim 1, further including:
   transferring the compressed data to a computer having a processor that is configured to decompress the compressed data.

6. The method of claim 5, wherein:
   the processor of the computer is configured to decompress the compressed data by performing the steps of:
   inverse run length encoding the compressed data to form at least one interleaved array of data;
   converting the at least one interleaved array of data into at least one transposed array of data;
   transposing the at least one transposed array of data to form at least one segmented array of data.

7. The method of claim 6, wherein:
   the processor of the computer is configured to assemble a plurality of segmented arrays of data to form a stream of data that is substantially identical to the original stream of digital data.

8. The method of claim 1, further including:
   utilizing a data acquisition system selected from the group consisting of glow discharge atomic emissions spectrometers, thermal gravimetric analyzers, ash fusion measuring devices, calorimeters, elemental analyzers, digital microscopes, mass spectrometers, and audio devices to provide the original stream of digital data to the processing device.

9. The method of claim 1, wherein:
the processing device comprises at least one of a Field-Programmable Gate Array and a Graphics Processing Unit.

10. The method of claim 1, further including:
providing a personal computer; and
transferring compressed data from the data acquisition system to the personal computer.

11. The method of claim 1, further including:
causing the processing device to determine if a first data location is zero and to transpose the at least one segmented array of data only if the first data location is zero.

12. The method of claim 11, further including:
causing the processing device to generate a stream of data comprising uncompressed data and compressed data that is stored in memory.

13. The method of claim 1, wherein:
the original stream of digital data comprises N numbers comprising measured data taken at discreet time intervals, and each number comprises a magnitude of a measured variable.

14. The method of claim 1, further including:
causing the processing device to 1) determine a difference between two data sets at a time and location; 2) preserve a sign of a difference utilizing a sign parameter; 3) determine an absolute value of the difference; 4) compressing the difference; and 5) storing the compressed difference and the sign parameter.

15. An analytical instrument comprising:
a data acquisition system that is configured to generate a stream of digital data comprising N numbers of size n corresponding to a magnitude of a measured variable in which at least some of the numbers include at least one zero, and wherein the system includes;
a processing device that is configured to receive a stream of data comprising N numbers of size n from the data acquisition system, the processing device configured to:
cause the processing device to segment at least a portion of the stream of data to form at least one segmented array of data;
cause the processing device to transpose the at least one segmented array of data to form at least one transposed array of data;
cause the processing device to split the at least one transposed array of data to form at least one interleaved array of data to thereby save at least a byte in memory that can be utilized to store run length information;
cause the processing device to run length encode leading zeros of the numbers to form compressed data comprising run length information to reduce the amount of memory required to store the data; and
store the compressed data in memory.

16. The analytical instrument of claim 15, wherein:
the processing device is configured to reverse the transposed array of data.

17. The analytical instrument of claim 15, wherein:
the processing device is configured to segment the at least one portion of the stream of data into at least one segmented array of size n×n.

18. The analytical instrument of claim 17, wherein:
the processing device is configured to transform the at least one segmented array into a (2n)×(n/2) interleaved array.

19. The analytical instrument of claim 15, wherein:
the analytical instrument includes at least one memory storage unit comprising a hard disk and/or solid state memory, and wherein the processing device is configured to store compressed data on the memory storage unit.

20. The analytical instrument of claim 15, wherein:
the analytical instrument is selected from the group consisting of glow discharge atomic emissions spectrometers, thermal gravimetric analyzers, ash fusion measuring devices, calorimeters, elemental analyzers, digital microscopes, mass spectrometers, and audio devices.

* * * * *